(12) United States Patent
Minnick et al.

(10) Patent No.: US 11,501,928 B2
(45) Date of Patent: Nov. 15, 2022

(54) MEMS DEVICE BUILT ON SUBSTRATE WITH RUTHENIUM BASED CONTACT SURFACE MATERIAL

(71) Applicant: Menlo Microsystems, Inc., Irvine, CA (US)

(72) Inventors: Andrew Minnick, Queensbury, NY (US); Christopher F. Keimel, Niskayuna, NY (US); Xu Zhu, Belmont, MA (US)

(73) Assignee: MENLO MICROSYSTEMS, INC., Irvine, CA (US)

( * ) Notice: Subject to any disclaimer, the term of this patent is extended or adjusted under 35 U.S.C. 154(b) by 0 days.

(21) Appl. No.: 16/832,408

(22) Filed: Mar. 27, 2020

(65) Prior Publication Data

US 2021/0304973 A1    Sep. 30, 2021

(51) Int. Cl.
*B81C 1/00*    (2006.01)
*H01H 1/0237*    (2006.01)
*H01H 49/00*    (2006.01)
*H01H 59/00*    (2006.01)
(Continued)

(52) U.S. Cl.
CPC .......... *H01H 1/0237* (2013.01); *H01H 49/00* (2013.01); *H01H 59/0009* (2013.01); *H01L 21/00* (2013.01); *B81C 1/0015* (2013.01); *B81C 1/00166* (2013.01); *B81C 1/00182* (2013.01); *H01H 2001/0052* (2013.01)

(58) Field of Classification Search
CPC ........................ B81C 1/00261; B81C 2203/01
See application file for complete search history.

(56) References Cited

U.S. PATENT DOCUMENTS

| | | |
|---|---|---|
| 5,479,042 A | 12/1995 | James |
| 6,963,117 B2 | 11/2005 | Yang |
| 7,034,393 B2 | 4/2006 | Alie et al. |

(Continued)

OTHER PUBLICATIONS

Umemoto, T., etc., "The behavior of Surface Oxide Film on Ruthenium and Rhodium Plated Contacts," IEEE Transactions of components, hybrids and manufacturing technology, vol. CHMT-1, No. 1. (Mar. 1978).

(Continued)

*Primary Examiner* — Moazzam Hossain
(74) *Attorney, Agent, or Firm* — Hamilton, Brook, Smith & Reynolds, P.C.

(57) ABSTRACT

A method of fabricating and packaging an ohmic micro-electro-mechanical system (MEMS) switch device may comprise constructing the switch device on an insulating substrate. The switch device may have contacts that consist of a platinum-group metal. The method may further comprise forming an oxidized layer of the platinum-group metal on an outer surface of each of the one or more contacts. The method may further comprise bonding an insulating cap to the insulating substrate, to hermetically seal the switch device. The bonding may occur in an atmosphere that has a proportion of oxygen within a range of 0.5% to 30%, such that, after the switch device has been hermetically sealed within the sealed cavity, an atmosphere within the sealed cavity has a proportion of oxygen within the range of 0.5% to 30%. The platinum-group metal may be ruthenium, and the oxidized layer of the platinum-group metal may be ruthenium dioxide.

12 Claims, 8 Drawing Sheets

(51) Int. Cl.
*H01L 21/00* (2006.01)
*H01H 1/00* (2006.01)

(56) References Cited

U.S. PATENT DOCUMENTS

| | | | |
|---|---|---|---|
| 7,064,442 | B1 | 6/2006 | Lane et al. |
| 7,288,940 | B2 | 10/2007 | Wynne et al. |
| 7,357,017 | B2 | 4/2008 | Felton et al. |
| 7,504,841 | B2 | 3/2009 | Frame et al. |
| 7,608,534 | B2 | 10/2009 | Yun et al. |
| 7,612,537 | B2 | 11/2009 | Wynne et al. |
| 7,728,610 | B2 | 6/2010 | Frame et al. |
| 7,906,359 | B2 | 3/2011 | Wachtmann |
| 7,928,584 | B2 | 4/2011 | O Suilleabhain et al. |
| 7,928,794 | B2 | 4/2011 | Balboni |
| 7,968,364 | B2 | 6/2011 | Schirmer |
| 8,124,436 | B2 | 2/2012 | Schirmer |
| 8,154,365 | B2 | 4/2012 | Chan et al. |
| 8,194,382 | B2 | 6/2012 | Ellis et al. |
| 8,215,151 | B2 | 7/2012 | Sammoura et al. |
| 8,294,539 | B2 | 10/2012 | Ellis et al. |
| 8,368,490 | B2 | 2/2013 | Goggin et al. |
| 8,946,879 | B2 | 2/2015 | Goida |
| 9,583,294 | B2 | 2/2017 | Lee et al. |
| 9,604,841 | B2 | 3/2017 | Gregory et al. |
| 9,659,717 | B2 | 5/2017 | Lee et al. |
| 9,748,048 | B2 | 8/2017 | Fitzgerald et al. |
| 9,758,367 | B2 | 9/2017 | Kaanta |
| 9,764,946 | B2 | 9/2017 | Chen et al. |
| 9,911,563 | B2 | 3/2018 | Macnamara et al. |
| 10,033,179 | B2 | 7/2018 | Fitzgerald et al. |
| 10,283,582 | B2 | 5/2019 | Stenson et al. |
| 10,388,468 | B2 | 8/2019 | Sampath |
| 10,529,518 | B2 | 1/2020 | Fitzgerald et al. |
| 10,825,628 | B2 | 11/2020 | Lee et al. |
| 10,843,920 | B2 | 11/2020 | Krishna et al. |
| 2007/0115082 | A1 | 5/2007 | Schirmer |
| 2012/0175715 | A1 | 7/2012 | Hammond |
| 2017/0062889 | A1* | 3/2017 | Lee ................ H01H 59/0009 |
| 2018/0144879 | A1 | 5/2018 | Sampath |
| 2021/0067160 | A1 | 3/2021 | Zhao et al. |

OTHER PUBLICATIONS

Hydes, P.C., "Electrodeposited Ruthenium as an Electrical Contact Material"., Platinum Metals Rev, 24, (2), 50-55 , (1980).
Sharma, S., et al., "Oxidation of Ruthenium," IEEE Transactions of components, hybrids and manufacturing technology, vol. CHMT-6, No. 1. (Mar. 1983).
Yokokawa, T., et al., "Thickness of ruthenium oxide film produced by the surface deactivation treatment of ruthenium-plated contact reed switches," Proceedings of the 35th IEEE Holm Conference on Electrical Contacts, pp. 177-181, 1 (1989).
Ryden, W.D., et al., "Temperature Dependence of the Resistivity of $RuO_2$ and $IrO_2$," Physics Letters, vol. 26A, No. 5, Jan. 29, 1968.
Vadimsky, R.G., et al., "Ru and $RuO_2$ as Electrical Contact Material: Preparation and Environmental Interactions," J. Electrochem. Soc.: Solid-State Science and Technology, (Nov. 1979.).
Hawk, R., et al., "Properties of Ruthenium Oxide Coatings," Journal of the Arkansas Academy of Science, vol. 45 ) 1991).
Slade, P., etc., "Electrical Contacts—Principles and Applications," 2nd Edition, CRC Press, Apr. 6, 2017.
Iwasaki, Y, et al., "Oxidation and Reduction of thin Ru Films by Gas plasma," Applied Surface Science, vol. 253, (2007).
Krusin-Elbaum, L., etc., "Conducting Transition Metal Oxides: Possibilities for $RuO_2$ in VLSI Metalization," J. Electrochem Soc. : Solid-State Science and Technology, Oct. 1988.
Zhang, H.X., et al., "Atomic Layer Deposition of $RuO_2$ Thin Films on $SiO_2$ Using $Ru(EtCp)_2$ and $O_2$ Plasma," IEEE China Semiconductor Technology International Conference. Date not available.
G. M. Rebeiz, "RF MEMS—Theory, Design, and Technology" (2002).
Walker, M., et al., "Impact of in situ Oxygen Plasma Cleaning on the Resistance of Ru and Au—Ru based RF Microelectromechanical System Contacts in Vacuum," J. of Applied Physics, 107, 084509, (2010).
Brand, V., etc., "Impact of Contact Materials and Operating Conditions on Stability of Micromechanical Switches," Tribol Lett 51:341-356; (2013).
International Search Report and Written Opinion of PCT/US2021/024382 dated Jun. 22, 2021 titled "MEMS Device Built on Substrate With Ruthenium Based Contact Surface Material".

* cited by examiner

MEMS DEVICE BUILT ON SUBSTRATE WITH RUTHENIUM BASED CONTACT SURFACE MATERIAL

BACKGROUND

Devices such as Micro-Electro-Mechanical System (MEMS) switches often require packages to protect the microscale features from environmental contaminants. These packages are typically either discrete or formed through wafer bonding processes. A MEMS switch may not operate reliably and consistently when exposed to uncontrolled operational environmental conditions. Moisture and contamination could cause either a lack of initial performance or an increase in early device failures. Accordingly, it is common practice to contain such devices within a protective package, which, at least to some extent, separates an internal device environment from an external environment. The processes associated with enclosing the devices within a protective package are critical to creating a reliable and long-lasting, hermetically sealed switch device.

Examples of prior art MEMS switches with $RuO_2$ contacts, which are built on a silicon substrate and sealed in a hermetically sealed package, may be found, for example, in U.S. Pat. Nos. 7,968,364; 8,124,436; 9,583,294; 9,784,048; 10,388,468; and in U.S. Patent Application Publication No. 2007/0115082.

SUMMARY

Embodiments of the invention are directed to a hermetically sealed bonded wafer stack containing a Micro-Electro-Mechanical System (MEMS) switch, where the MEMS switch contains a Ruthenium Oxide (e.g., $RuO_2$) contact, which is encased within a sealed, isolated environment that contains oxygen, or a mixture of oxygen, nitrogen, and/or noble gases.

Example embodiments herein describe a MEMS switch device that is built on a substrate with the stoichiometric rutile structure Ruthenium Dioxide ($RuO_2$) as the contact surface material. The MEMS switch device is hermetic sealed by a bonding process, e.g., thermal compression (TC) wafer bonding process, in an environment containing a minority oxygen ($O_2$) and other inert gas, e.g. argon (Ar) and/or nitrogen ($N_2$). The contact material may be Ru, or a stack of metals with Ru as the top and exposed contact material, or a Ru alloy. The example embodiments further describe a process flow directed to creating the $RuO_2$ (a conductive oxide) contact surfaces, which are formed at the pre-bonding, oxygen plasma ash cleaning process of the glass substrate. Energized oxygen ions generated by plasma effectively react with Ru atoms on the contact material top surfaces to create a high-quality thin layer $RuO_2$ that is generated during the plasma ash cleaning. The resulting $RuO_2$ contacts enable the MEMS switch device to maintain a low contact resistance value throughout billions of switch cycles.

The example embodiments further describe several device enhancement techniques. One technique relates to encapsulating oxygen inside the cavity to mitigate organic contamination accumulation on contact surfaces, which improves fabrication yield and switch device longevity. Another enhancement technique is a pre-bonding oxygen thermal treatment to increase the thickness of the $RuO_2$ contact. Inert gas may be added to the sealed environment to further improve the switch's lifetime.

In the example embodiments, a MEMS switch device may be built on a wafer based substrate, e.g., silicon, silicon dioxide ($SiO_2$), fused silica, silica glass, quartz, sodium-doped glass, borosilicate glass, sapphire, SOI, et al. The $RuO_2$ contact surface material may be created by oxygen plasma ash of the glass substrate, and the deposited Ru contact material, before the thermal compression (TC) bonding process. The typical expectation of oxygen plasma ash is to clean any organic residual material on the substrate, including contact surfaces. The clean stoichiometric oxidized contact surface leads to low and stable contact resistance. Additional treatment steps, such as introducing oxygen at pre-bonding temperature ramping phase or during a mechanical bonding phase, will further solidify and thicken $RuO_2$ contact layers.

In one aspect, the invention may be a method of fabricating and packaging an ohmic micro-electro-mechanical system (MEMS) switch device, comprising constructing the ohmic MEMS switch device on a substrate. The ohmic MEMS switch device may have one or more contacts that consist of a platinum-group metal. Within a first chamber, the method may further comprise forming an oxidized layer of the platinum-group metal on an outer surface of each of the one or more contacts. Within a second chamber, the method may further comprise bonding a cap to the substrate, thereby hermetically sealing the ohmic MEMS switch device within a sealed cavity formed by the cap and the substrate. The bonding may occur in a bonding atmosphere that has a proportion of oxygen within a range of 0.05% to 30%, such that, after the ohmic MEMS switch device has been hermetically sealed within the sealed cavity, a cavity atmosphere within the sealed cavity has a proportion of oxygen within the range of 0.05% to 30%.

In an embodiment, the substrate and the cap may each comprise an insulating material. The platinum-group metal may be ruthenium (Ru), and the oxidized layer of the platinum-group metal may be ruthenium dioxide ($RuO_2$). Constructing the ohmic MEMS switch device may further comprise forming the ohmic MEMS switch device on the substrate using a thin-film microfabrication process. Forming the oxidized layer of the platinum-group metal on the outer surface of each of the one or more contacts may comprise performing an oxygen plasma ash procedure on the ohmic MEMS switch device. The method may further comprise performing an oxygen plasma ash cleaning procedure on the ohmic MEMS switch device, after forming the oxidized layer of the platinum-group metal on the outer surface of the one or more contacts, to enhance the oxidized layer of the platinum-group metal on the outer surface of the one or more contacts.

The bonding atmosphere may have a proportion of oxygen within a range of 0.05% to 30%. Bonding the cap to the substrate may further comprise subjecting the cap and the substrate to a bonding temperature, and pressing the cap and the substrate together with a bonding force, according to a profile that characterizes the bonding temperature and the bonding force with respect to time.

The substrate may be one of a plurality of substrates on a first wafer, and the cap may be one of a plurality of caps on a second wafer. Bonding the cap to the substrate may further comprise subjecting the first wafer and the second wafer to a bonding temperature, and pressing the first wafer and the second wafer together with a bonding force, according to a profile that characterizes the bonding temperature and the bonding force with respect to time. The bonding atmosphere may further comprise one or both of (i) nitrogen ($N_2$) and (ii) a noble inert gas.

In another aspect, the invention may be a switching apparatus, comprising an ohmic micro-electro-mechanical system (MEMS) switch device constructed on a substrate. The ohmic MEMS switch device may have one or more contacts consisting of a platinum-group metal. The switching apparatus may further comprise an oxidized layer of the platinum-group metal formed on an outer surface of each of the one or more contacts, and a cap disposed upon, and bonded to, the substrate, to form a hermetically sealed cavity that encloses the ohmic MEMS switch device. A cavity atmosphere within the sealed cavity may have a proportion of oxygen within a range of 0.05% to 30%.

The substrate and the cap may each comprise an insulating material. The platinum-group metal may be ruthenium (Ru), and the oxidized layer of the platinum-group metal may be ruthenium dioxide ($RuO_2$). The ohmic MEMS switch device may be formed on the substrate using a thin-film microfabrication process. The oxidized layer of the platinum-group metal on the outer surface of each of the one or more contacts may be formed using an oxygen plasma ash procedure on the ohmic MEMS switch device. The oxidized layer of the platinum-group metal may be enhanced using an oxygen plasma ash cleaning procedure on the ohmic MEMS switch device after forming the oxidized layer of the platinum-group metal on the outer surface of the one or more contacts.

The cavity atmosphere within the sealed cavity may have a proportion of oxygen within a range of 0.05% to 30%. To bond the cap to the substrate, the cap and the substrate may be subjected to a bonding temperature, and the cap and the substrate may be pressed together with a bonding pressure, according to a profile that characterizes the bonding temperature and the bonding pressure with respect to time. The insulating substrate may be one of a plurality of insulating substrates on a first insulating wafer, and the insulating cap may be one of a plurality of insulating caps on a second insulating wafer.

To bond the insulating cap to the insulating substrate, the first insulating wafer and the second insulating wafer may be subjected to a bonding temperature, and the first insulating wafer and the second insulating wafer may be pressed together with a bonding pressure, according to a profile that characterizes the bonding temperature and the bonding pressure with respect to time. The cavity atmosphere may further comprise one or both of (i) nitrogen ($N_2$) and (ii) a noble inert gas.

In another aspect, the invention may be a method of fabricating and packaging an ohmic micro-electro-mechanical system (MEMS) switch device comprising constructing the ohmic MEMS switch device on a fused silica substrate using a thin-film microfabrication process. The ohmic MEMS switch device may have one or more contacts that consist of ruthenium (Ru). The method may further comprise, within a first chamber, forming layer of ruthenium dioxide ($RuO_2$) on an outer surface of each of the one or more contacts, and within a second chamber, bonding a fused silica cap to the fused silica substrate, thereby hermetically sealing the ohmic MEMS switch device within a sealed cavity formed by the cap and the substrate. The bonding may occur in a bonding atmosphere that has a proportion of oxygen within a range of 0.05% to 30%, such that, after the ohmic MEMS switch device has been hermetically sealed within the sealed cavity, a cavity atmosphere within the sealed cavity has a proportion of oxygen within the range of 0.05% to 30%. The method may further comprise performing an oxygen plasma ash procedure on the ohmic MEMS switch device, after forming the $RuO_2$ on the outer surface of the one or more contacts, to enhance the $RuO_2$ on the outer surface of the one or more contacts.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

The teachings of all patents, published applications and references cited herein are incorporated by reference in their entirety.

Ruthenium (Ru) as contact material, with ruthenium dioxide ($RuO_2$) as contact surface material, has been adopted since the 1960's in various mechanical relay and reed switch products. Besides low and stable contact resistance, the $RuO_2$ contact exhibits desired mechanical properties, such as extremely high hardness, good resistance to corrosion, and resistance to wear. In the hot switching application (i.e., opening or closing the switching contacts while a signal is being conveyed), $RuO_2$ demonstrates a capability to withstand high-intensity arcing and to be resistant to sticking or pitting. Although the example embodiments herein describe an Ru contact with $RuO_2$ contact surface material, other embodiments may utilize a contact comprising any platinum-group metal (e.g., Ru, Rh, Pd, Os, Ir, or Pt), and a corresponding oxide layer of the platinum-group metal.

Ru will grow a native, self-inhibit oxide surface layer when it is exposed to an environment containing O2. If the oxidation temperature is over a certain threshold (in most literature reported at above 200° C.), the stoichiometric Ruthenium Dioxide ($RuO_2$) layer will form instead of other types of Ru oxide (e.g., RuO, $RuO_3$ and $RuO_4$). The stoichiometric $RuO_2$ is a conductive oxide material with intrinsic resistivity of about $3.5\sim4.6\times10^{-5}\Omega\cdot cm$. This value is greater than the Ru intrinsic resistivity of $6.71\sim7.16\times10^{-6}$ $\Omega\cdot cm$, but much lower than other forms of Ru oxide. Under room temperate and gas environment, the oxidation process of Ru on its surface is self-limited up to 10 Å. The surface $RuO_2$ has a dense lattice structure that limits penetration of $O_2$ to form more $RuO_2$ underneath, resulting in other types of Ru oxide. It has been discovered that a non-stoichiometric $RuO_2$ dominated contact will have 5 to 10 times higher contact resistance as compared to stoichiometric $RuO_2$, and this resistance increases over the time of switch operation, whereas stoichiometric $RuO_2$ exhibits a stable low contact resistance.

Other approaches to form $RuO_2$ include oxygen plasma treatment, sputtering $RuO_2$ directly on surface in an $Ar/O_2$ mixed environment, Chemical Vapor Deposition(CVD), or Atomic Layer Deposition (ALD). The sputtering approach can yield much thicker oxidation layer than other methods. For these reasons, MEMS switches may be fabricated with Ru as the contact material, rather than gold, silver, copper, aluminum, and other such highly conductive metals.

MEMS switches are generally built on a semiconductor substrate (e.g., silicon), because MEMS fabrication historically originated from silicon CMOS processing technology. The majority of MEMS device manufacturing infrastructure is therefore based on the use of a silicon substrate. Accordingly, the expectation/prediction is that, going forward, commercialization of MEMS switch technology will be predominantly implemented on a silicon-based substrate. Only for special applications (e.g., microwave technology) are MEMS switch devices built on substrate other than silicon.

A hard material, such as Ru, may be coated onto a gold (Au) MEMS switch contact to extend switch life cycles. The hard material itself employed as a contact, however, will not prevent the early failure in switch cycling operation, typically less than a few hundred million cycles. Failure mechanisms may include wear-out, micro-welding, surfacing roughening due to fracture, and organic/polymer contaminants accumulation on surface. Oxidization of the Ru contact surface, or the direct deposition of $RuO_2$ as contact material, may greatly improve MEMS switch thermomechanical performance, and reduce organic accumulation on the contact surfaces. MEMS switch devices are typically packaged in a sealed, clean environment, to guarantee the device performance over a long lifetime, which is a widely adopted approach in traditional mechanical switch and relay products to avoid moisture and contamination of the switch contacts.

Figure 1A:
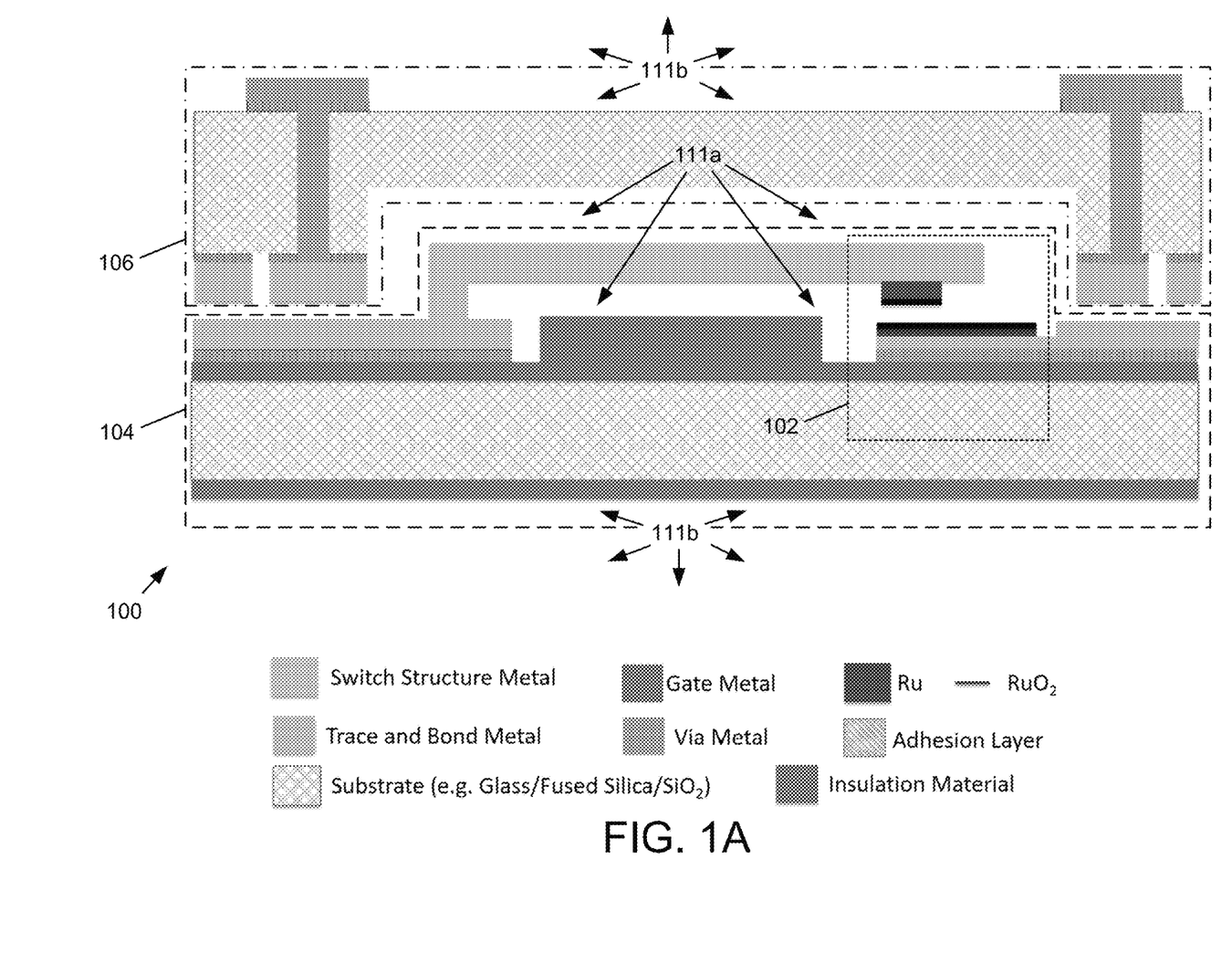
FIG. 1A illustrates a detailed cross section of an example embodiment of a switch device according to the invention.
Figure 1B:
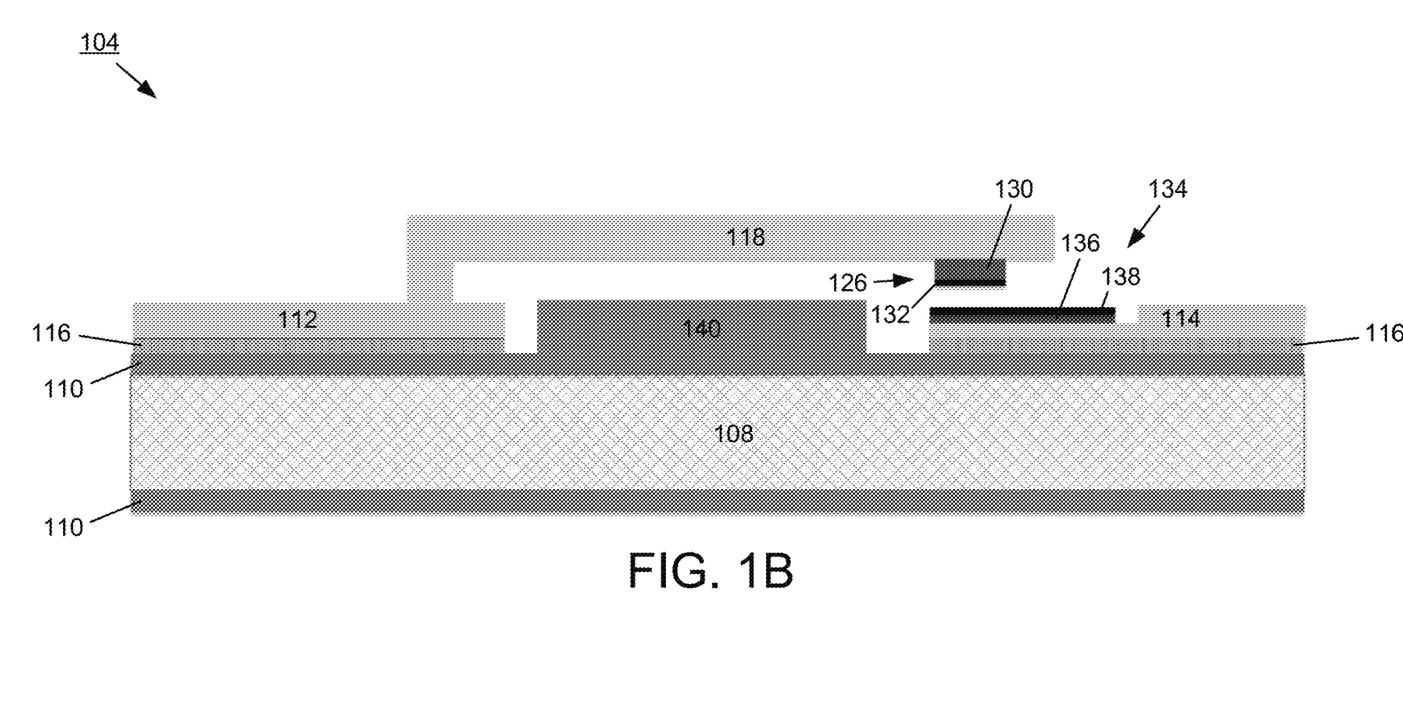
FIG. 1B shows an isolated view of the substrate portion of the switch device shown in FIG. 1A.
Figure 1C:
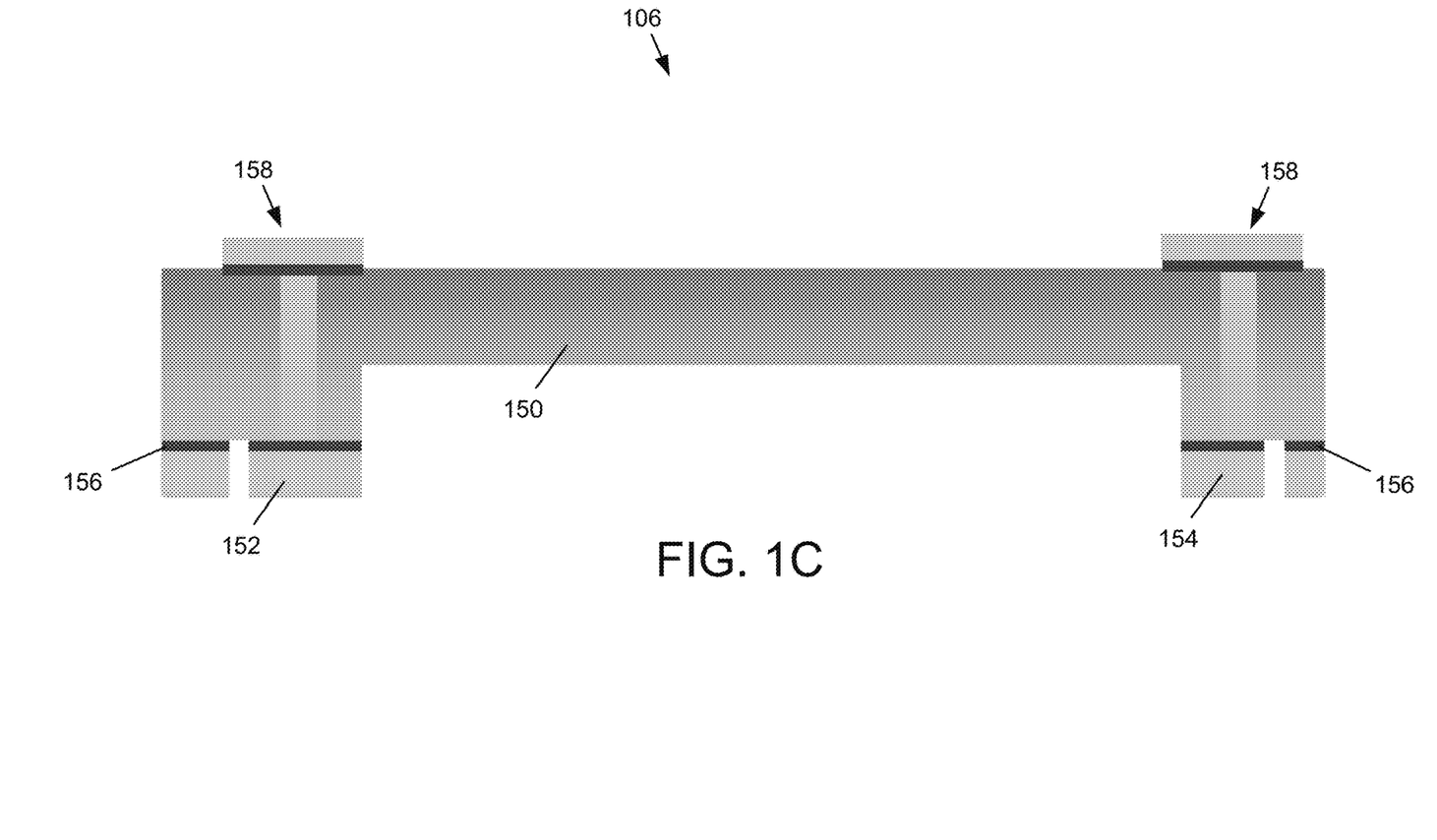
FIG. 1C shows an isolated view of the cap portion of the switch device shown in FIG. 1A.
Figure 1D:
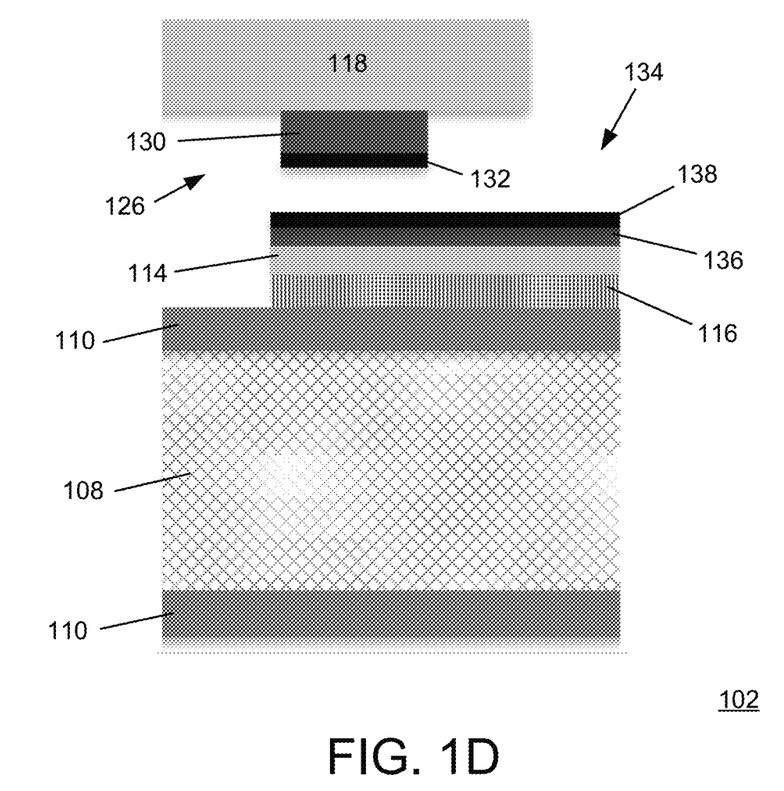
FIG. 1D shows an enlarged view of the contacts region of the switch device shown in FIG. 1A.

The example embodiments described herein present a MEMS ohmic contact switch that may be built on an insulating substrate, e.g., silicon dioxide, fused silica, silica glass, quartz, sodium-doped glass, and borosilicate glass, although other non-insulating substrate materials (e.g., silicon) may alternatively be used. In an example embodiment, fused silica may be chosen as the base substrate material due to its property of extremely low electrical loss. This property facilitates a switch device that has superior low insertion loss for RF and microwave applications, as well as excellent isolation for use as a high-power DC and/or RF or microwave switch. In the example embodiments, $RuO_2$ may be formed on both the top and bottom MEMS switch contact surfaces, which facilitates a switch life cycle that extends beyond billions of cycles. FIG. 1A illustrates a detailed cross section of an example embodiment of a switch device 100 according to the invention. FIGS. 1B, 1C and 1D illustrate detailed views of certain portions of the switch device depicted in FIG. 1A.

Referring to FIG. 1A, the example switch device 100 comprises a substrate portion 104, shown in isolation in FIG. 1B, and a cap portion 106, which is shown in isolation in FIG. 1C. The contacts region 102 of the switch device 100 is shown in isolation and enlarged in FIG. 1D.

Referring to the example embodiment depicted in FIG. 1B, the substrate portion 104 of the switch device 100 may comprise a substrate (e.g., fused silica) 108. An electrically-insulating material layer 110 may be deposited on one or both of the top surface and the bottom surface of the insulator substrate 108. A first bonding site 112 and a second bonding site 114, both comprising a bonding metal used to mechanically and electrically connect the switch device substrate 104 to its corresponding cap 106. Various metals and metal stacks can be used for either metal compression or metal eutectic bonding approaches. (metal stack can be for metal compression bonding or metal eutectic bonding). The bonding metal of the first and second bonding sites 112, 114, may be formed on an adhesion layer 116 deposited on the insulating material layer 110. The first and second bonding sites 114, 116 may bond with corresponding metal bonding sites on the cap portion 106 during the bonding procedure described herein. Such bonding defines a cavity 111a (see FIG. 1A) around the switch elements (e.g., the beam, gate, and switching contacts, described herein) that isolates the switch elements from the environment 111b outside of the switch device 100. The environment within the cavity 111a can be different in pressure and gas composition than the environment 111b surrounding the bonded switch device.

A first end of the beam 118 may be anchored to an electrically conductive trace that is in electrical communication to the bonding site 112 and mechanically coupled to the substrate 108. A first contact arrangement 126 may be disposed at a second end of the beam 118. The first contact arrangement 126 may comprise a Ru layer 130 mechanically coupled to the underside of and in electrical communication with the beam 118, and a $RuO_2$ layer 132 formed on the outer surface of the Ru layer 130. A second and corresponding contact arrangement 134 may comprise a Ru layer 136 deposited on an extension of a conductive trace that is in electrical communication to a bonding site (114) and mechanically adhered to the substrate 108, and a $RuO_2$ layer 138 formed on the outer surface of the Ru layer 136. The second contact 134 should be positioned below the beam and with similar X and Y coordinates as the first contact 126 such that when the beam is actuated by the gate electrode 140 and pulled toward the substrate the first and second contact surfaces touch and are in electrical communication. While in the example embodiment, the Ru layer 136 is deposited on the extension of the second bonding site 114, other embodiments may have the Ru layer deposited on a site other than a bonding site. For example, in some embodiments additional electrical circuit elements may be situated between the third contact arrangement 134 and the bonding site 114.

A gate structure 140 may comprise a conductive metal layer 142 deposited on the insulator substrate 108. The gate structure 140 may be used to produce an electromotive force on the beam 118, which causes the beam to flex until the $RuO_2$ layer 132 of the first contact arrangement 126 is in electrical contact with the $RuO_2$ layer 138 of the second contact arrangement 134.

Referring to FIG. 1C, the cap portion 106 of the switch device 100 may comprise an insulator cap 150, which comprises an insulating material such as fused silica or other such insulating material known in the art. A third bonding site 152 and a fourth bonding site 154, both comprising a bonding material such as, for example, gold (Au), may be formed on an adhesion layer 156 such as, for example, tantalum (Ta), deposited on the insulator cap 150, in positions conducive to bonding with the first bonding site 112 and the second bonding site 114. At least one conductive, hermetically sealed through-glass vias (TGV) 158 may be disposed in the insulator cap 150, which facilitates electrical signals being conducted to and/or from components of the switch device 100 that are sealed within the cavity formed after the cap portion 106 is bonded to the substrate portion 104.

In contrast to approaches that use a process with oxygen to oxidize Ru contact surface in the wafer bonding equipment, or that directly sputter $RuO_2$ material, the described embodiments employ an oxygen plasma ash process for two purposes prior to thermal compression (TC) bonding. The first purpose of the oxygen plasma ash process is to clean out organic contamination on contact surfaces. The second purpose of the oxygen plasma ash process is to deactivate the Ru contact surface to form $RuO_2$. The subsequent bonding process is performed in an environment that contains a proportion of oxygen between 0.05% and 30%, although for the example embodiments, the oxygen proportion may not exceed 20%. In other embodiments, the bonding environment may supplement the oxygen with one or more other gases, for example nitrogen ($N_2$), and/or a noble inert gas such as argon (Ar).

Because the $RuO_2$ layer is formed during the oxygen plasma ash process, and prior to bonding of the cap to the substrate in the bonding chamber, oxygen captured within the sealed, encapsulated device environment between the cap and substrate will not be substantially depleted by Ru contact oxidation during the bonding process. Consequently, the oxygen proportion of the gas sealed within the device environment may be at or near the oxygen proportion of the gas flow supplied during the bonding process. In an example environment, the proportion of oxygen in the sealed device environment may be 20%, although other environments may exhibit a proportion of oxygen between 0.05% and 30%.

Figure 2:
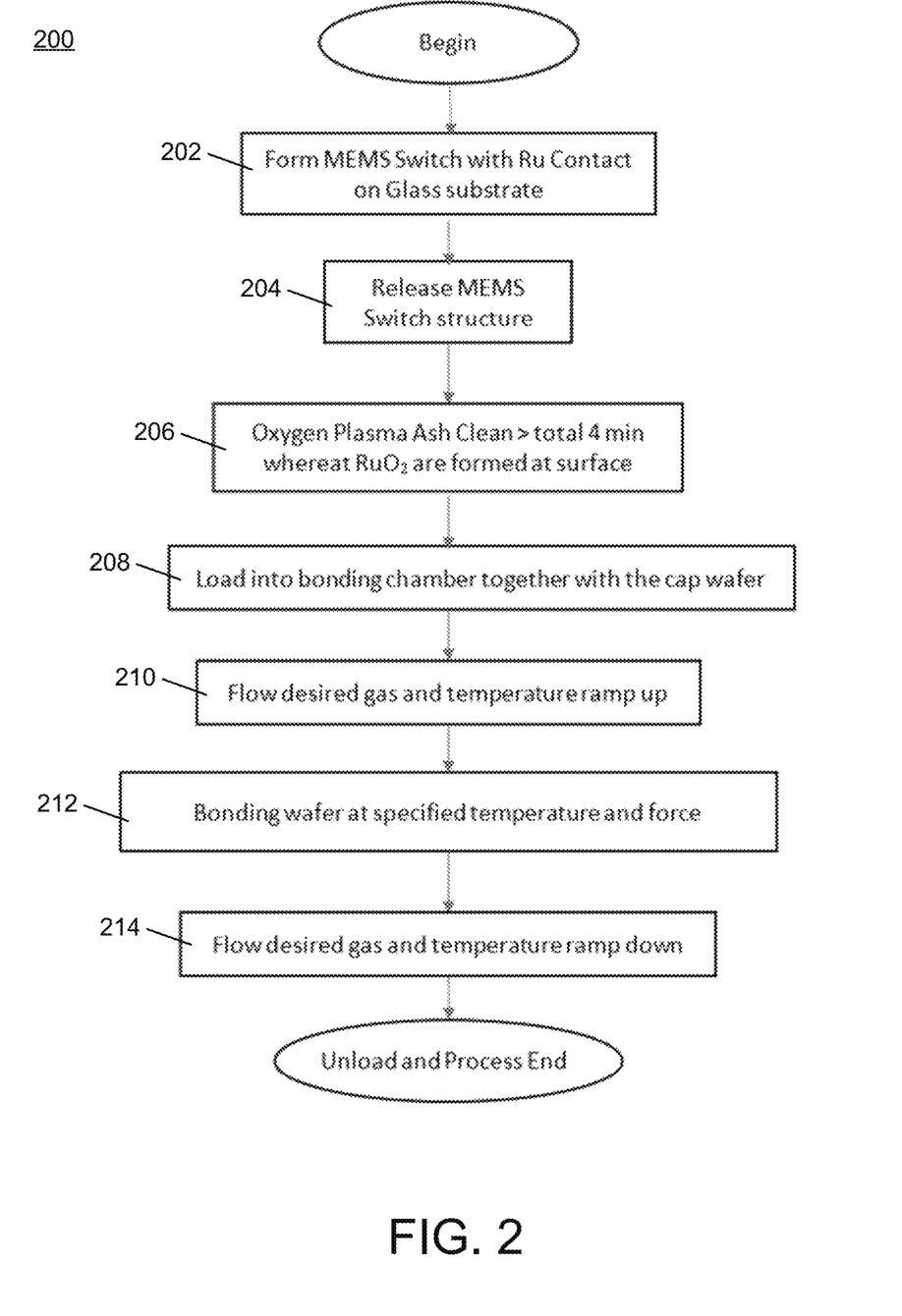
FIG. 2 depicts an example embodiment of a process flow for preparing and bonding a glass substrate wafer hosting MEMS switches and glass cap wafers.

FIG. 2 depicts an example embodiment of a process flow 200 for preparing and bonding a substrate wafer, which may host one or more MEMS switches, with a cap wafer. This example embodiment is directed to the use of a glass substrate wafer and a glass cap wafer, although other embodiments may utilize other insulating or non-insulating wafers. Further, it should be understood that any cap with suitable mating surfaces to facilitate bonding to the substrate portion in a wafer bonding process may be used.

The process flow 200 may comprise forming 202 the device (e.g., the MEMS switch) on the glass substrate (e.g., the MEMS wafer), releasing 204 the MEMS switch structure (i.e., eliminating sacrificial support structures so that the switch components that are intended to be movable are free to move, thereby exposing the Ru contact surfaces), performing 206 an oxygen plasma ash clean procedure for at least 1 minute (4 minutes+/−0.1 minute in an example embodiment), The MEMS wafer is bonded to a corresponding cap wafer to encapsulate the device and enable the hermetic sealing of the device within an oxygen containing environment. The cap wafer may be prepared through typical microfabrication processes to include any electrically functional or mechanical layers. The cap wafer contains materials and features to facilitate the bonding of the cap wafer to its corresponding MEMS device wafer, thus hermetically encapsulating the device.

The substrate portion 104 and the cap portion 106 are aligned and loaded 208 into a thermal compression (TC) bonding chamber. Once the substrate portion 104 and the cap portion 106 are loaded into the bonding chamber, the process 200 continues by flowing 210 gas of a desired composition into the bonding chamber to a desired pressure, ramping up the chamber temperature, and bonding 212 the substrate and cap wafers at a specific temperature and force. The flow 214 of desired gas continues as the temperature is ramped down to conclude the example bonding process.

In one embodiment, gas is flowed 210 into the bond chamber to a desired pressure (described in more detail herein), a first bond force is applied (typically 20% or less of the subsequent second bond force) to contact the wafers (to one another), the temperature in the bonding chamber is ramped up, a second and higher force (bond force) is applied, thereby bonding 212 the cap portion 106 to the substrate portion 104. The bond chamber is maintained with the desired gas at its respective pressure, and the bond force is reduced to the first bond force (or similarly low force), and the temperature in the bonding chamber is ramped down.

Figure 3:
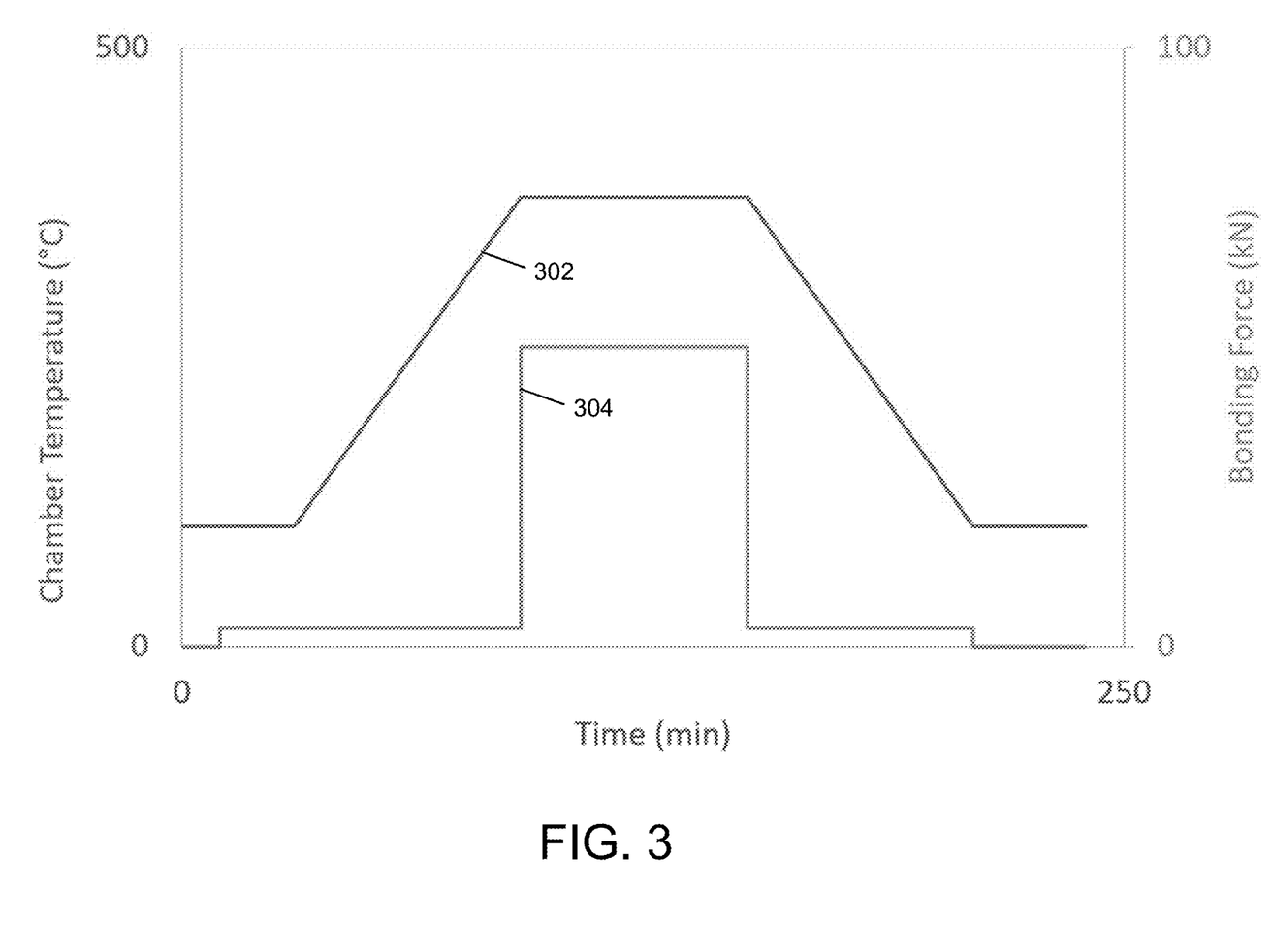
FIG. 3 shows an example embodiment of a thermal compression (TC) bonding profile according to the invention.

In the process flow 200, a conductive oxide contact surface (e.g., $RuO_2$) may be formed during the oxygen plasma ash process step 206, before MEMS wafers are loaded into thermal compression bonding equipment. An example TC profile, according to the invention, is shown in FIG. 3, with the chamber temperature 302 (in ° C.), shown along with the applied bonding force 304 (in kN). It should be understood that the temperatures and pressures depicted in FIG. 3 are examples presented for descriptive purposes only, and are not intended to be limiting. In general, the bonding temperature and pressure profile may fall within a range suitable for accomplishing the bond between the substrate and the cap as described herein. No special bonding treatment, beyond those of ordinary bonding processes that do not perform Ru oxidizing, is required to accommodate oxidizing the Ru contact surface. The gas used to fill the bonding chamber may be a $N_2/O_2$ mixture, or clean dry air (CDA), or an inert gas/$O_2$ mixture, or just inert gas, or any gas just mentioned mixed with one or more noble inert gases.

During oxygen plasma ash treatment, the stoichiometric rutile oxide, $RuO_2$, may be formed at the outer surface of the Ru contact. Highly reactive $O_2$ atoms may penetrate the surface of bulk Ru, but may form non-stoichiometric $RuO_X$ underneath the surface (where X is a positive real number). An anneal with $O_2$ will convert such $RuO_X$ to $RuO_2$. As a result, additional optional steps after $O_2$ plasma ash and before the wafer bonding phase can yield thicker and higher percentage of $RuO_2$ as surface contact material. These options are demonstrated, for example, in FIGS. 5A, 5B, and 5C.

Figure 4A:
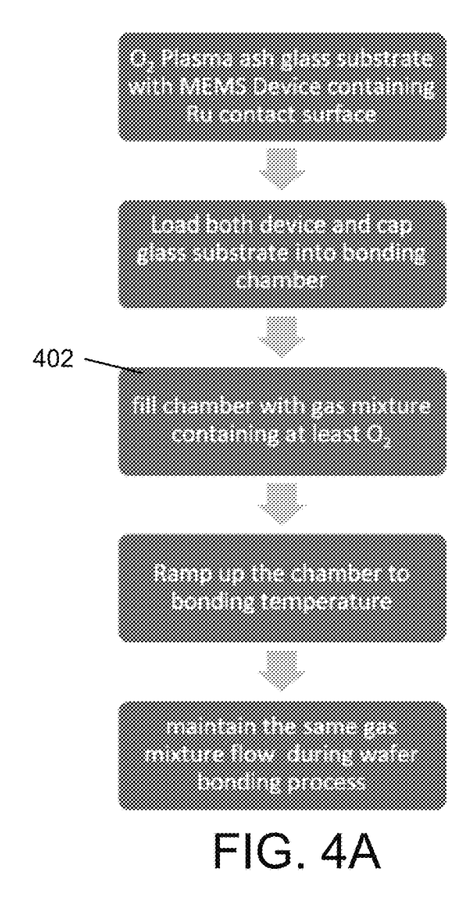
FIG. 4A shows an example embodiment that comprises flowing a gas containing oxygen into the bonding chamber according to the invention.
Figure 4B:
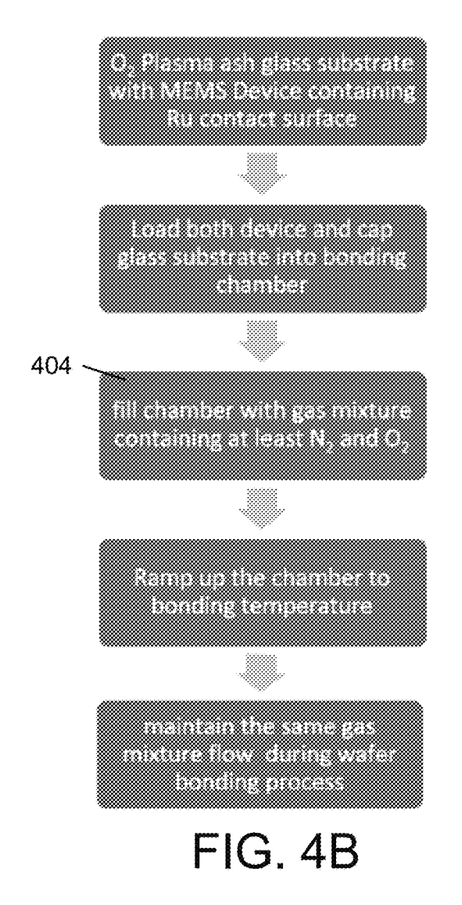
FIG. 4B shows an example embodiment that comprises flowing a gas containing nitrogen into the bonding chamber according to the invention.
Figure 4C:
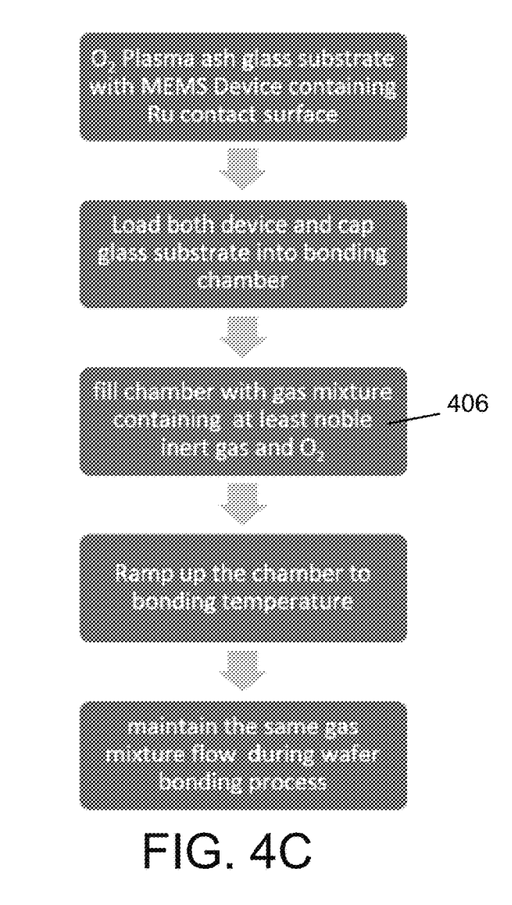
FIG. 4C shows an example embodiment that comprises flowing a gas containing a noble inert gas into the bonding chamber according to the invention.

FIG. 4A shows an example embodiment that comprises flowing 402 a gas containing oxygen ($O_2$) into the bonding chamber once the oxygen plasma ash steps are performed and the substrate and cap portions are loaded into the bonding chamber. FIG. 4B shows an example embodiment that comprises flowing 404 a gas containing nitrogen ($N_2$), in addition to oxygen, into the bonding chamber once the oxygen plasma ash steps are performed and the substrate and cap portions are loaded into the bonding chamber. FIG. 4C shows an example embodiment that comprises flowing 406 a gas containing a noble inert gas into the bonding chamber once the oxygen plasma ash steps are performed and the substrate and cap portions are loaded into the bonding chamber. In other embodiments, the inert gas may be combined with $O_2$, $N_2$, or both. In all three embodiments (FIGS. 4A, 4B, and 4C), the final step shown concerns continuing the flow of gas described in steps 402, 404, and 406, respectively, as the bond between the substrate portion and the cap portion is formed.

Figure 5A:
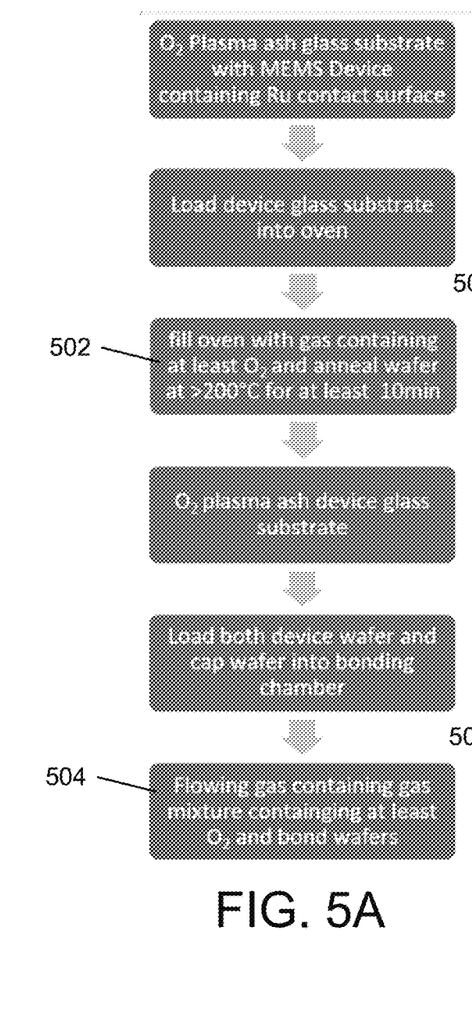
FIGS. 5A, 5B, and 5C show example embodiments that address pretreatment steps to form the $RuO_2$ contact layer according to the invention.
Figure 5B:
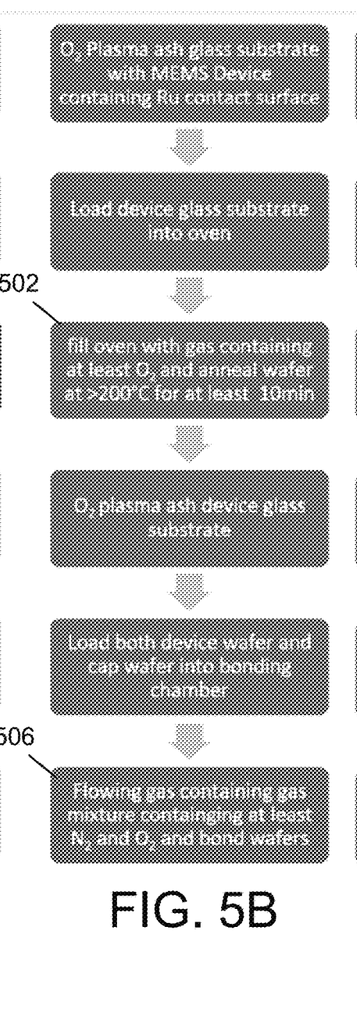
Figure 5C:
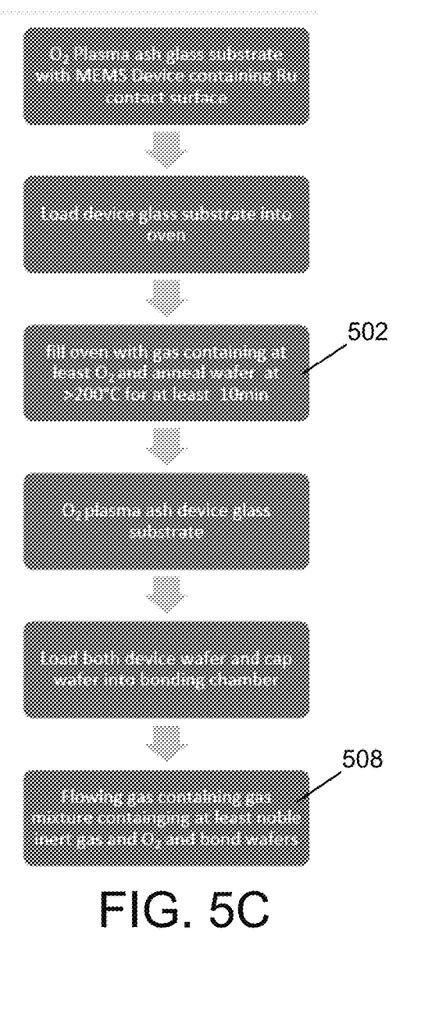

FIGS. 5A, 5B, and 5C show example embodiments that address pretreatment steps to form the $RuO_2$ contact layer described herein, prior to the bonding process. The $RuO_2$ layer is formed in a chamber (e.g., an oven) separate from the bonding chamber, rather than creating the $RuO_2$ layer during the oxygen plasma ash. The $RuO_2$ layer may be reinforced during the oxygen plasma ash. All three embodiments (FIGS. 5A, 5B, and 5C) show, after loading the MEMS device into an oven, filling 502 the oven with an oxygen-containing gas and annealing the device at greater than 200° C. for at least 10 minutes. FIGS. 5A, 5B, and 5C show flowing oxygen 504, nitrogen 506, or a noble gas 508, respectively, in the bonding chamber.

While example embodiments have been particularly shown and described, it will be understood by those skilled in the art that various changes in form and details may be made therein without departing from the scope of the embodiments encompassed by the appended claims.

What is claimed is:

1. A method of fabricating and packaging an ohmic micro-electro- mechanical system (MEMS) switch device, comprising:
    constructing the ohmic MEMS switch device on a substrate, the ohmic MEMS switch device having one or more contacts that consist of a platinum-group metal;
    within a first processing chamber, forming an oxidized layer of the platinum-group metal on an outer surface of each of the one or more contacts;
    within a second processing chamber that is separate from the first processing chamber, bonding a cap to the substrate, thereby hermetically sealing the ohmic MEMS switch device within a sealed cavity formed by the cap and the substrate, the bonding occurring in a bonding atmosphere that has a proportion of oxygen within a range of 0.05% to 30%, such that, after the ohmic MEMS switch device has been hermetically sealed within the sealed cavity, a cavity atmosphere within the sealed cavity is substantially the same as the bonding atmosphere and has a proportion of oxygen within the range of 0.05% to 30%.

2. The method of claim 1, wherein the substrate and the cap each comprises an insulating material.

3. The method of claim 1, wherein the platinum-group metal is ruthenium (Ru), and the oxidized layer of the platinum-group metal is ruthenium dioxide ($RuO_2$).

4. The method of claim 1, wherein constructing the ohmic MEMS switch device further comprises forming the ohmic MEMS switch device on the substrate using a thin-film microfabrication process.

5. The method of claim 1, wherein forming the oxidized layer of the platinum-group metal on the outer surface of each of the one or more contacts comprises performing an oxygen plasma ash procedure on the ohmic MEMS switch device.

6. The method of claim 1, further comprising performing an oxygen plasma ash cleaning procedure on the ohmic MEMS switch device, after forming the oxidized layer of the platinum-group metal on the outer surface of the one or more contacts, to enhance the oxidized layer of the platinum-group metal on the outer surface of the one or more contacts.

7. The method of claim 1, wherein the bonding atmosphere has a proportion of oxygen within a range of 0.05% to 30%.

8. The method of claim 1, wherein bonding the cap to the substrate further comprises subjecting the cap and the substrate to a bonding temperature, and pressing the cap and the substrate together with a bonding force, according to a profile that characterizes the bonding temperature and the bonding force with respect to time.

9. The method of claim 1, wherein the substrate is one of a plurality of substrates on a first wafer, and the cap is one of a plurality of caps on a second wafer, and bonding the cap to the substrate further comprises subjecting the first wafer and the second wafer to a bonding temperature, and pressing the first wafer and the second wafer together with a bonding force, according to a profile that characterizes the bonding temperature and the bonding force with respect to time.

10. The method of claim 1, wherein the bonding atmosphere further comprises one or both of (i) nitrogen ($N_2$) and (ii) a noble inert gas.

11. A method of fabricating and packaging an ohmic micro-electro-mechanical system (MEMS) switch device, comprising:
    constructing the ohmic MEMS switch device on a fused silica substrate using a thin-film microfabrication process, the ohmic MEMS switch device having one or more contacts that consist of ruthenium (Ru);
    within a first processing chamber, forming a layer of ruthenium dioxide (RuO2) on an outer surface of each of the one or more contacts;
    within a second processing chamber that is separate from the first processing chamber, bonding a fused silica cap to the fused silica substrate, thereby hermetically sealing the ohmic MEMS switch device within a sealed cavity formed by the cap and the substrate, the bonding occurring in a bonding atmosphere that has a proportion of oxygen within a range of 0.05% to 30%, such that, after the ohmic MEMS switch device has been hermetically sealed within the sealed cavity,
    a cavity atmosphere within the sealed cavity is substantially the same as the bonding atmosphere and has a proportion of oxygen within the range of 0.05% to 30%.

12. The method of claim 11, further comprising performing an oxygen plasma ash procedure on the ohmic MEMS switch device, after forming the $RuO_2$ on the outer surface of the one or more contacts, to enhance the $RuO_2$ on the outer surface of the one or more contacts.

* * * * *